(12) United States Patent
Clare et al.

(10) Patent No.: US 7,961,102 B2
(45) Date of Patent: Jun. 14, 2011

(54) RFID TAGS FOR PALLETS AND CARTONS AND SYSTEM FOR ATTACHING SAME

(75) Inventors: Thomas J. Clare, Media, PA (US); Andre Cote, Williamstown, NJ (US)

(73) Assignee: Checkpoint Systems, Inc., Philadelphia, PA (US)

(*) Notice: Subject to any disclaimer, the term of this patent is extended or adjusted under 35 U.S.C. 154(b) by 136 days.

(21) Appl. No.: 12/202,762

(22) Filed: Sep. 2, 2008

(65) Prior Publication Data

US 2009/0015412 A1    Jan. 15, 2009

Related U.S. Application Data

(62) Division of application No. 11/457,890, filed on Jul. 17, 2006, now Pat. No. 7,436,305.

(51) Int. Cl.
*G08B 23/00* (2006.01)
*G06K 19/02* (2006.01)

(52) U.S. Cl. ............................ 340/572.1; 235/488

(58) Field of Classification Search ..... 340/572.1–572.9; 700/117, 108–110; 439/567; 235/488–492
See application file for complete search history.

(56) References Cited

U.S. PATENT DOCUMENTS

| | | | | |
|---|---|---|---|---|
| 4,605,844 A | * | 8/1986 | Haggan | 235/380 |
| 4,900,983 A | * | 2/1990 | Kato et al. | 313/471 |
| 4,970,495 A | * | 11/1990 | Matsumoto et al. | 340/572.1 |
| 5,071,445 A | * | 12/1991 | Oppenlaender et al. | 44/408 |
| 5,083,942 A | * | 1/1992 | Hahn | 439/567 |
| 5,497,140 A | | 3/1996 | Tuttle | |
| 5,528,222 A | * | 6/1996 | Moskowitz et al. | 340/572.7 |
| 5,710,458 A | * | 1/1998 | Iwasaki | 257/679 |
| 6,107,920 A | * | 8/2000 | Eberhardt et al. | 340/572.7 |
| 6,259,369 B1 | * | 7/2001 | Monico | 340/572.8 |
| 6,988,666 B2 | | 1/2006 | Appalucci et al. | |
| 7,227,470 B2 | * | 6/2007 | Nedblake | 340/572.1 |
| 7,242,996 B2 | * | 7/2007 | Roesner | 700/117 |
| 7,382,265 B2 | * | 6/2008 | Kwak et al. | 340/572.7 |
| 2003/0051806 A1 | | 3/2003 | Appalucci et al. | |
| 2005/0252605 A1 | * | 11/2005 | Green et al. | 156/264 |

FOREIGN PATENT DOCUMENTS

| | | |
|---|---|---|
| EP | 0704816 A2 | 4/1996 |
| WO | 03092174 A1 | 11/2003 |

OTHER PUBLICATIONS

Patrick Griss et al, Sensors and Actuators A: Physical vol. 95, Issues 2-3, Jan. 1, 2002, pp. 94-99.*
European Search Report on European Patent Application (EP 10 16 1430) dated May 20, 2010.

* cited by examiner

*Primary Examiner* — Benjamin C Lee
*Assistant Examiner* — Sigmund Tang
(74) *Attorney, Agent, or Firm* — Caesar, Rivise, Bernstein, Cohen & Pokotilow, Ltd.

(57) ABSTRACT

A method for installing an RFID tag on shipping articles includes applying a strip of conductive material to the surface of the article and providing an RFID chip having a body, a first bottom conductive point, a second bottom conductive point and a nonconductive fin between the first bottom conductive point and the second bottom conductive point. The fin is received in the shipping article. The RFID chip is attached to the shipping article by inserting the chip onto the strip of conductive material on the shipping article such that the fin severs the strip into a first strip and a second strip. The first bottom conductive point is electrically attached to the first strip and the second bottom conductive point is electrically attached to the second strip.

9 Claims, 6 Drawing Sheets

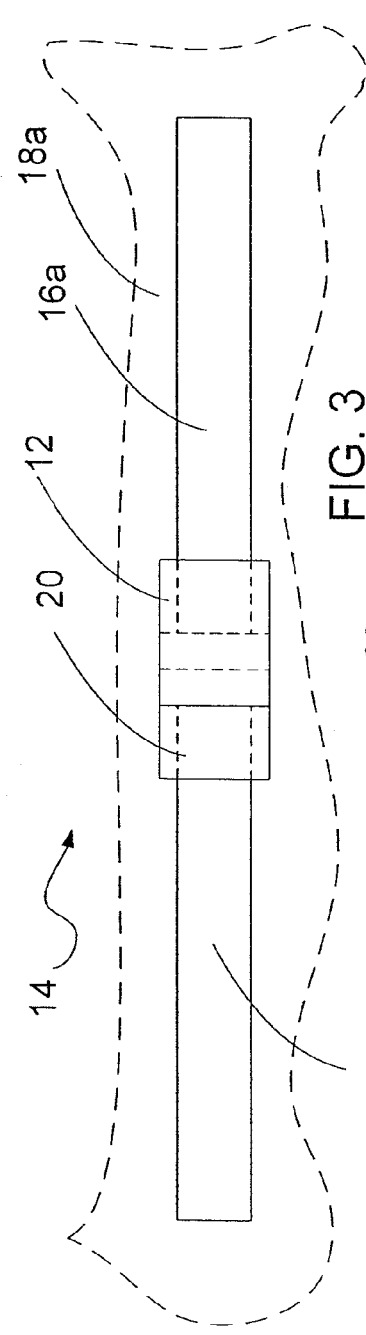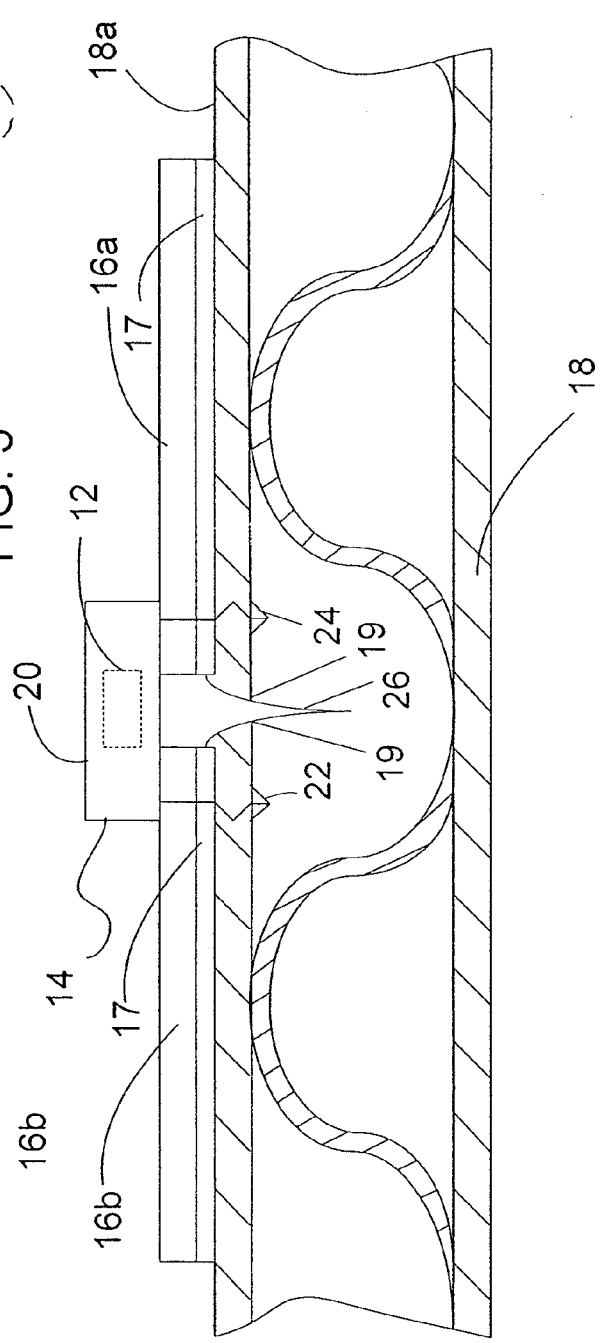

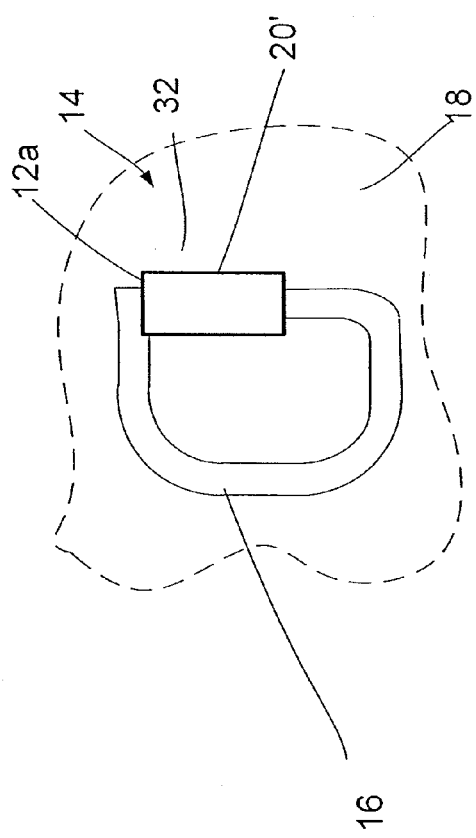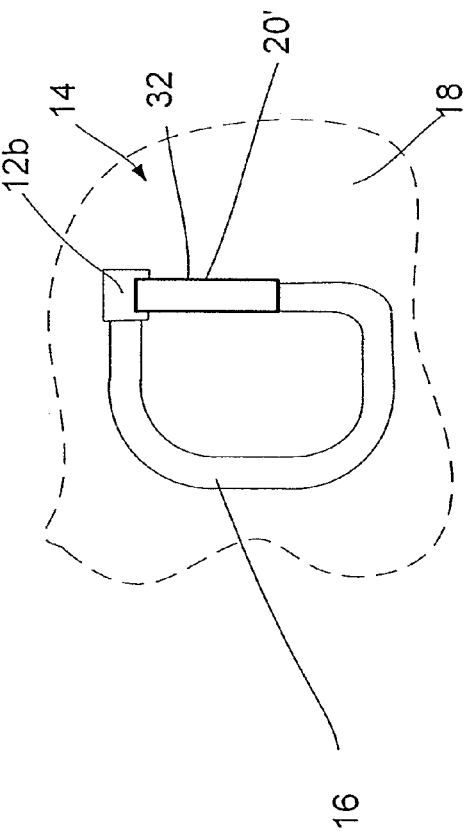

RFID TAGS FOR PALLETS AND CARTONS AND SYSTEM FOR ATTACHING SAME

CROSS REFERENCES TO RELATED APPLICATIONS

This application is a Divisional Application of utility U.S. application Ser. No. 11/457,890, entitled RFID Tags for Pallets and Cartons and Systems for Attaching Same, filed Jul. 17, 2006, which claims priority to provisional U.S. Application Ser. No. 60/700,431, entitled RFID Tags for Pallets and Cartons and Systems for Attaching Same, filed Jul. 19, 2005.

BACKGROUND OF THE INVENTION

This invention is related to security tags, and, in particular, to providing RFID tags and attaching such tags onto pallets and cartons in high volume.

The two largest components of the cost of RFID tags today are the integrated circuit (IC) and the attachment of that IC to an antenna structure. Moore's Law and increasing volume of RFID tags being made are helping to drive the IC cost down, but the primary method for attachment of the IC to the antenna structure is bonding. Bonding is a mechanical process that does not benefit from the same technology advances or economies of scale as the manufacture of an IC.

Current methods of chip bonding do not adequately address cost. A two-step approach of an intermediary "strap" achieves incremental cost improvement by relocating the costs. However, straps do not address the problem directly, as bonding is still required, but to a smaller tag. Moreover, straps add another step to bond the strap to the big tag.

Current manufacturers using standard bonding technology with straps want straps to be like traditional bonding surfaces, that is, hard and inflexible. But such straps do not lend themselves to easy integration into soft flexible tags. The known standard bonding processes are all strap-based solutions, and therefore less than ideal.

Standard electronic chip components are known and generally found on printed circuit boards. A bare IC is bonded to a carrier by wire bonding or flip chip bonding (a technique where the IC is bonded face down to the carrier). Then a package is molded around the carrier and chip. The package is then put onto a printed circuit board via thru-hole or surface mount assembly. Standard chip components need to be compatible with multiple printed circuit board assembly technologies (including solder baths, solder waves, IR reflow, and a variety of cleaning and baking steps), want more and more computational power put in single chip assemblies, and must be made to last.

In contradistinction, RFID tags are never soldered or baked or cleaned. RFID tags are complete unto themselves and do not have to be integrated into any other system. They require a bare minimum of computational power to minimize cost and energy consumption (which translates into read distance), and do not face the same power dissipation or environmental requirements as standard chips.

RFID tags are substantially different that standard electronic chip components. The metal layer is thin and flexible (or non-rigid) by comparison. The back or substrate of each tag is soft polypropylene or paper. The substrates are easy to punch, cut, dimple, and weld.

In designing an efficient chip placement process that can be integrated into RFID tags, it is beneficial to avoid anything that is not consistent with a continuous rolling printing press. Stopping and starting the line always slows things down. It would be beneficial to adjust tooling to operate on a chip that is continuously advancing down the line at a known rate of travel.

Retracing a path during the bonding process takes time, causes vibration, and wears mechanical linkages. These linkages also create uncertainty in absolute position. Rotating or continuous devices are thus preferred over reciprocating devices.

The greater the number of mechanical connections in a bonding process, the less certainty there is in precise position. Every jointed or flexible linkage introduces a certain amount of randomness as the web and chips wiggle around. IC dimensions are tiny. Movement of chips out of critical alignment is easily possible.

When manufacturing security tags, one cannot rely on any precise dimension set previously in a prior step. The relative position of things varies across the web, from one end of the roll to another, from place to place, and from time to time. That is simply the reality of working with inexpensive materials. For IC bonding processes, the manufacturer must constantly adapt to how the material is really behaving, rather than counting on it to behave as intended.

It would be beneficial to have a placement system for an IC on an antenna to create an RFID tag that operates at higher speeds than current systems for placement on cartons and pallets, is inexpensive and reliable to operate, and that provides high quality and reliable tags.

All references cited herein are incorporated herein by reference in their entireties.

BRIEF SUMMARY OF THE INVENTION

A method for installing an RFID tag on a shipping article is provided which includes the steps of applying a strip of conductive material to the surface of the shipping article (the strip of conductive material having a width), and providing an RFID chip having a body, a first bottom conductive point, a second bottom conductive point and a nonconductive fin between the first bottom conductive point and the second bottom conductive point. The fin extends downwardly from the body and is received in the shipping article. The fin has a width that is at least as wide as the width of the strip of conductive material. The RFID chip is attached to the shipping article by inserting the chip onto the strip of conductive material on the shipping article such that the fin severs the strip into a first strip and a second strip. The first bottom conductive point is electrically attached to the first strip and the second bottom conductive point is electrically attached to the second strip.

Preferably, the first bottom conductive point is a first barb extending from the bottom of the RFID chip and the second bottom conductive point is a second barb extending from the bottom of the RFID chip. Here, the fin extends between the first barb and the second barb.

The shipping articles may be, for example, pallets, cartons, cardboard boxes, and corrugated cardboard boxes. The first and second barbs may have a curved portion adjacent to the body, such that the RFID chip is attached to the shipping article with increased security.

The RFID chip is preferably encapsulated for structural support. A step of applying numerous RFID tags to shipping articles in an assembly line process may be included wherein the shipping article does not stop its movement for the receipt of the tag.

In an alternate embodiment, a method for installing an RFID tag on a shipping article is provided which includes the steps of applying a first strip and a second strip of conductive material to the surface of the shipping article, where the are strips co-linear and separated from one another by a small gap. An RFID chip is provided which has a body, a first contact point and a second contact point where the first and second contact points are each located on the bottom of the body. The method further includes the step of attaching the RFID chip to the shipping article by adhering the first contact point to the first strip of conductive material on the shipping article and adhering the second strip of conductive material to the second strip of conductive material on the shipping article.

Preferably, the first strip and a second strip of conductive material form two poles of a dipole antenna.

In another alternate embodiment of the present invention, a method for installing an RFID tag on a shipping article is included which includes the steps of applying a coil of conductive material to the surface of the shipping article where the coil of conductive material has a trace width, and providing an RFID chip having a body, a first bottom conductive point, a second bottom conductive point and a nonconductive fin between the first bottom conductive point and the second bottom conductive points. The fin extends downwardly from the body and is received in the shipping article. The fin has a width that is at-least as wide as the width of the of the trace of conductive material. The RFID chip is attached to the shipping article by inserting the chip onto the strip of conductive material on the shipping article such that the fin severs the coil. The first bottom conductive point is electrically attached to a first end of the severed coil and the second bottom conductive point is electrically attached to the second end of the severed coil.

In another alternate embodiment of the present invention, a method for installing an RFID tag on a shipping article is provided which includes the steps of applying a coil of conductive material to the surface of the shipping article, the coil having a first layer in the shape of a coil and a second layer (a short length of foil) where the second layer is adhered to the first layer. The method further includes the steps of providing an RFID chip having a body, a first bottom conductive point and a second bottom conductive point, and attaching the RFID chip to the shipping article by inserting the chip onto the coil on the shipping article such that the first bottom conductive point is electrically attached to the first layer and the second bottom conductive point is electrically attached to the second layer.

An RFID tag for use on a shipping article is also provided which includes a pair of conductive strips adhered to the shipping article and an RFID chip having a body, a first conductive point and a second conductive point and a nonconductive fin between the first conductive point and the second conductive point. The fin extends downwardly from the body and is received in the shipping article on the conductive material to form the pair of strips. The fin has a width that is at least as wide as the width of the conductive material. The conductive points each contact one of the pair of conductive strips.

Finally, an RFID tag on a shipping article is provided which includes conductive material adhered to the shipping article and an RFID chip having a body, a first barb, a second barb and a nonconductive fin between the first barb and the second barb. Each barb and the fin extend downwardly from the body and are received in the shipping article on the conductive material. The fin has a width that is at least as wide as the width of the conductive material.

BRIEF DESCRIPTION OF SEVERAL VIEWS OF THE DRAWINGS

The invention will be described in conjunction with the following drawings in which like reference numerals designate like elements and wherein:

FIG. 3 is a top view of an RFID tag constructed in accordance with the present invention, shown as mounted on a carton or pallet;

FIG. 4 is a partial cross-sectional view of the RFID tag of FIG. 3, shown as mounted on a carton;

FIG. 7a is a top view of an alternate 13.56 MHz RFID tag constructed in accordance with the present invention, shown as mounted on a carton or pallet having an RFID chip having a built in capacitor; and FIG. 7b is a top view of another alternate 13.56 MHz RFID tag constructed in accordance with the present invention, shown as mounted on a carton or pallet having an RFID chip without a built in capacitor, but having a second layer of foil acting as a capacitor.

DETAILED DESCRIPTION OF THE INVENTION

The invention will be illustrated in more detail with reference to the following embodiments, but it should be understood that the present invention is not deemed to be limited thereto.

Figure 1:
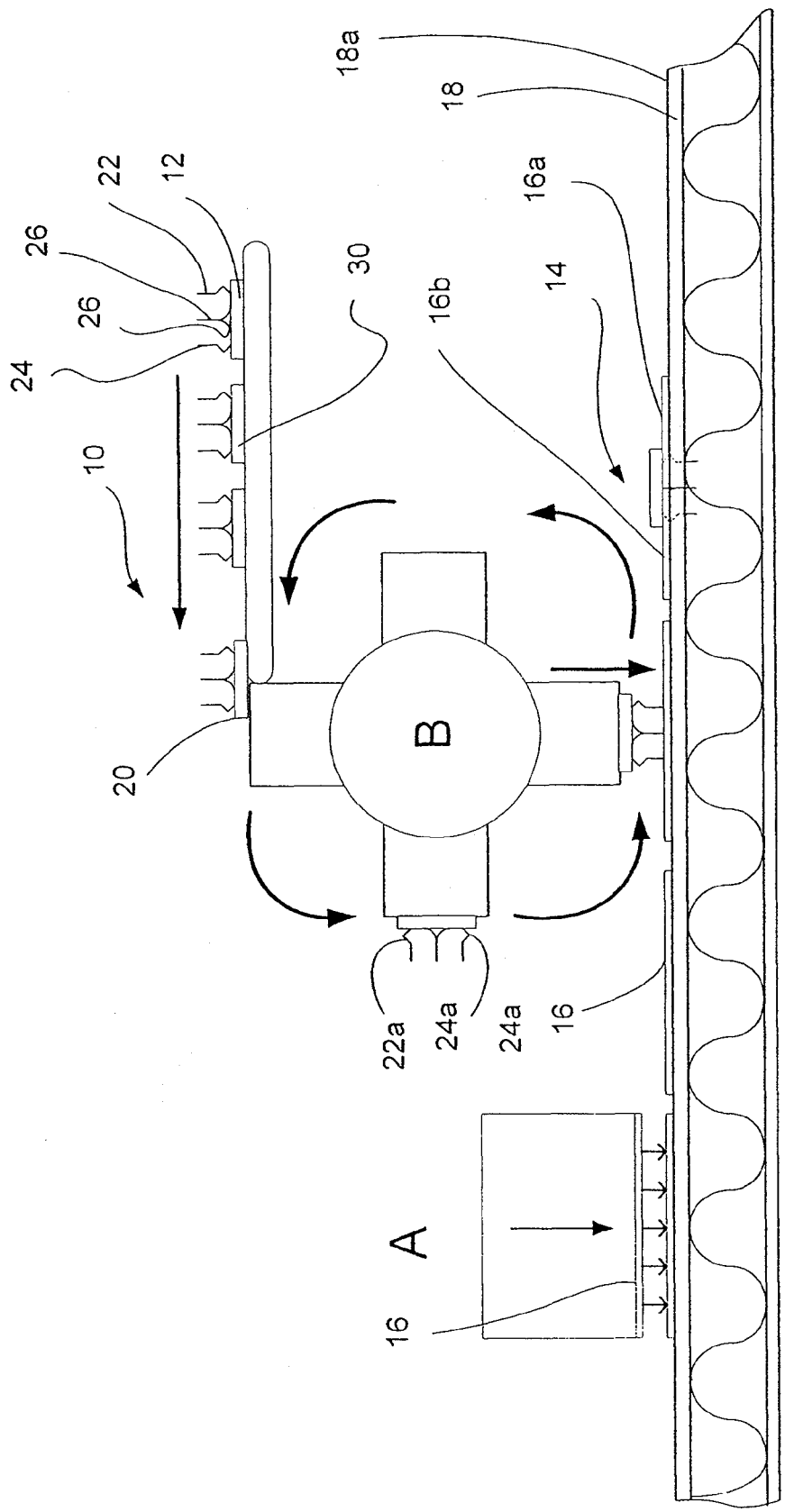
FIG. 1 is a simplified schematic view of a system for installing an RFID tag on a shipping article for use in accordance with a preferred embodiment of the method of the present invention.
Figure 2:
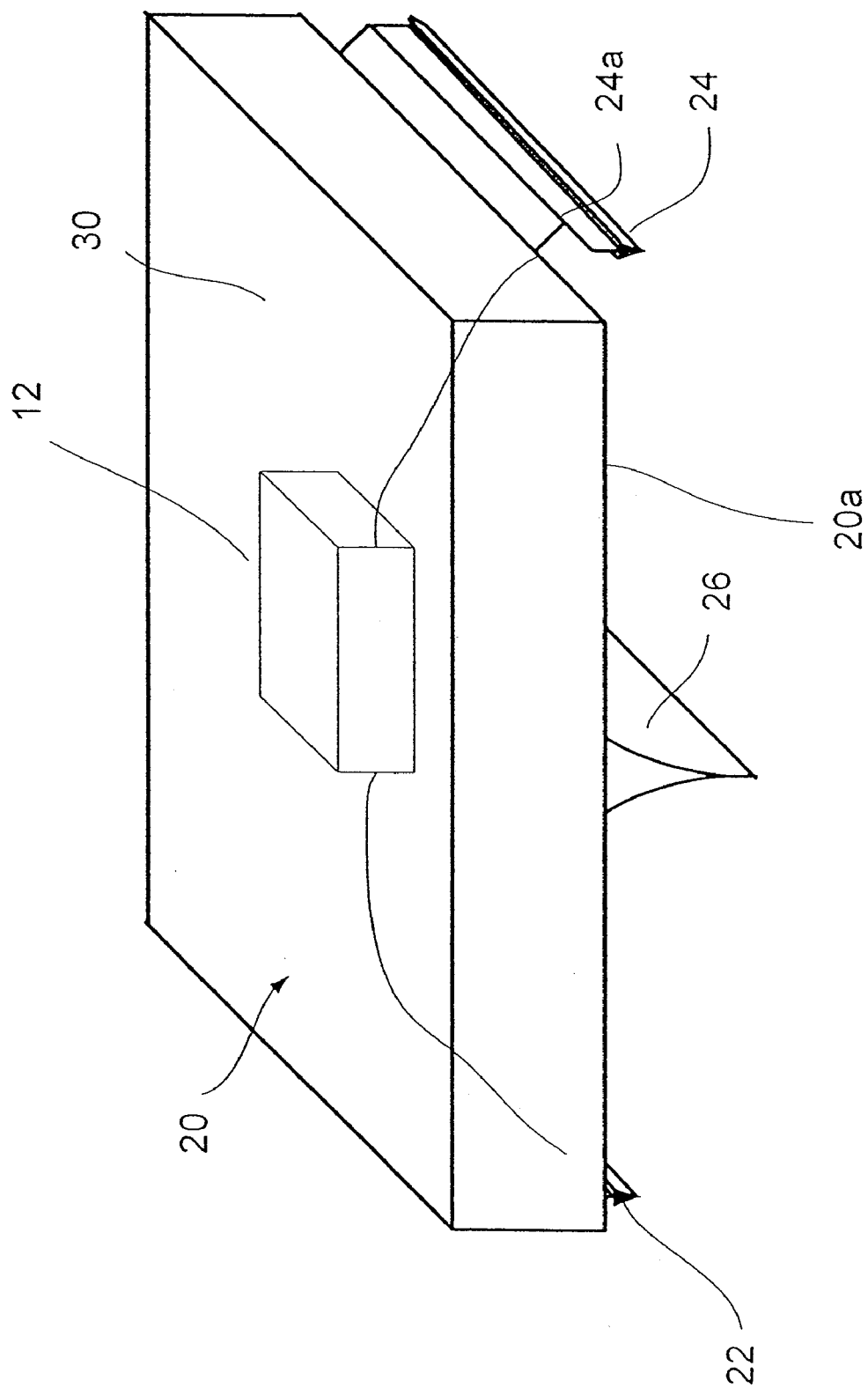
FIG. 2 is a simplified schematic view of an RFID chip for use in the system of FIG. 1.

Referring now to the drawings, wherein like part numbers refer to like elements throughout the several views, there is shown in FIG. 1 an apparatus for installing an RFID tag on a shipping article 10 in accordance with a preferred embodiment of the present invention. FIG. 2 depicts a novel RFID chip 12 that forms part of the RFID tag 14. In a first preferred embodiment, the method for installing the RFID tag 14 includes the steps of applying a strip of conductive material 16 to the surface 18a (see FIGS. 3 and 4) of the shipping article 18. The strip of conductive material 16 may be, for example, an elongated foil strip capable of being adhered in some manner to the shipping article 18. The shipping article may be, for example, a box or carton such as a corrugated cardboard carton (e.g., constructed from kraft paper and glue) or a shipping pallet made from wood. A schematic view of the apparatus 10 is shown in FIG. 1. First, at A in FIG. 1, strips of conductive material 16, such as thin sheets of aluminum foil are adhered to the shipping article 18 using, for example, adhesive 17 (see FIG. 3). This may be accomplished using various automated processes, as known. Specially manufactured RFID chips 12 (having barbs 22, 24 or the like and a nonconductive fin 26, as described below) are then moved into place at B and positioned over a shipping article 18, such as a carton or pallet. As the RFID chips 12 are placed over the strip of conductive material 16 and lowered, a nonconductive fin 26, protruding from the bottom of each RFID chip 12, severs the conductive material to form two separate poles of an RFID antenna.

It is noted that FIG. 1 is a simplified view that is not to scale and separate cartons are not shown.

The process is particularly beneficial for use in high speed applications. Current technologies provide for placement of RFID tags as a "stop and repeat" process operating at a maximum of only about 6 feet per minute. The present invention lends itself to much higher speed operation, for example, about two hundred feet per minute. This is made possible because the placement tolerances of the RFID chip 12 on the strips of conductive material that, in combination, form the RFID tag, are much more forgiving. Stop and repeat is not necessary. The present process can be accomplished on a high speed, nonstop basis, for example, at the time of fabrication of the shipping cartons themselves, without substantially slowing down the process.

As best seen in FIG. 2, the RFID chip 12 has a body 20, a first barb 22, a second barb 24 and a nonconductive fin 26 between the first barb 22 and the second barb 24. The barbs 22, 24 and the fin 26 extend downwardly from the body 20 and, during construction of the RFID tag 14, pierce the strip of conductive material and are fixed in place on the surface 18a of the shipping article 18. The fin 26 has a width that is at least as wide as the width of the strip of conductive material 16. The barbs 20, 22 are not as wide as the width of the strip of conductive material 16 to prevent severing at the locations of the barbs.

The RFID chip 12 is attached to the shipping article 18 by inserting the chip onto the strip of conductive material 16 on the shipping article 18 such that the fin 26 severs the strip into a first strip 16a and a second strip 16b and such that the first barb 22 is electrically attached adjacent to the sever line 19 to the first strip 16a and the second barb 24 is electrically attached adjacent to the sever line 19 to the second strip 16b. The two strips are not in direct electrical contact.

In a preferred embodiment, the first and second barbs 22, 24 each have a curved portion 22a, 24a (see FIG. 1), adjacent to bottom 20a of the body 20 of the RFID chip 12. See FIG. 2. This provides for the RFID chip 12 to be attached to the shipping article 18 with increased security.

Additionally, preferably, the RFID chip 12 is encapsulated using a known encapsulation material 30 for increased damage resistance and structural support. This may be accomplished by any of a number of well known encapsulation techniques. The barbs 22, 24 and nonconductive fin 26 protrude from the bottom of the now encapsulated chip.

The nonconductive fin may substantially any known nonconductive material that would operate to sufficiently isolate the two strips 16a, 16b once they are severed. For example, the nonconductive fin may be constructed from quartz.

It is noted that means other than barbs 22, 24 may be used to conductively attach the RFID chip 12 to the strips of conductive material 16a, 16b. For example, a small dot of a conductive adhesive may be used.

In an alternate embodiment of the present invention, a method for installing an RFID tag on a shipping article is again provided. However, in this embodiment, instead of a single strip of conductive material being used (as in the previous embodiment), this embodiment provides for two separate conductive strips 16a, 16b. See FIG. 4. For the sake of convenience, FIGS. 3, 4, and 5 related to the first embodiment above will be used because they adequately depict the present embodiment. The nonconductive fin 26 may or may not be provided on the RFID chip body 20. This embodiment of the present invention includes the steps of applying a first strip 16a and a second strip 16b of conductive material to the surface of the shipping article 18. The strips 16a, 16b are co-linear and separated from one another by a small gap. An RFID chip 12 is provided having a body 20, a first contact point and a second contact point (e.g., barbs 22, 24). The remaining steps of this embodiment are substantially the same as those listed above with respect to the first embodiment. The fin 26 is no longer necessary, but still may be used.

The result of performing the steps of the method of the present invention yields an RFID tag 14 that is located on a shipping article 18. The RFID tag 14 includes conductive material adhered to the shipping article and an RFID chip 12 having a body 20, a first and a second conductive point (e.g., first barb 22, second barb 24 or, e.g., dots of conductive adhesive, etc.) and a nonconductive fin 26 between the first barb and the second barb, each barb and the fin extending downwardly from the body and received in the shipping article on the conductive material, the fin having a width that is at least as wide as the width of the conductive material.

The strip of conductive material 16 can take on many forms. For example, as shown in FIGS. 1, 3 and 4, the strip 16 may be an elongate straight strip that forms a dipole antenna.

Figure 5:
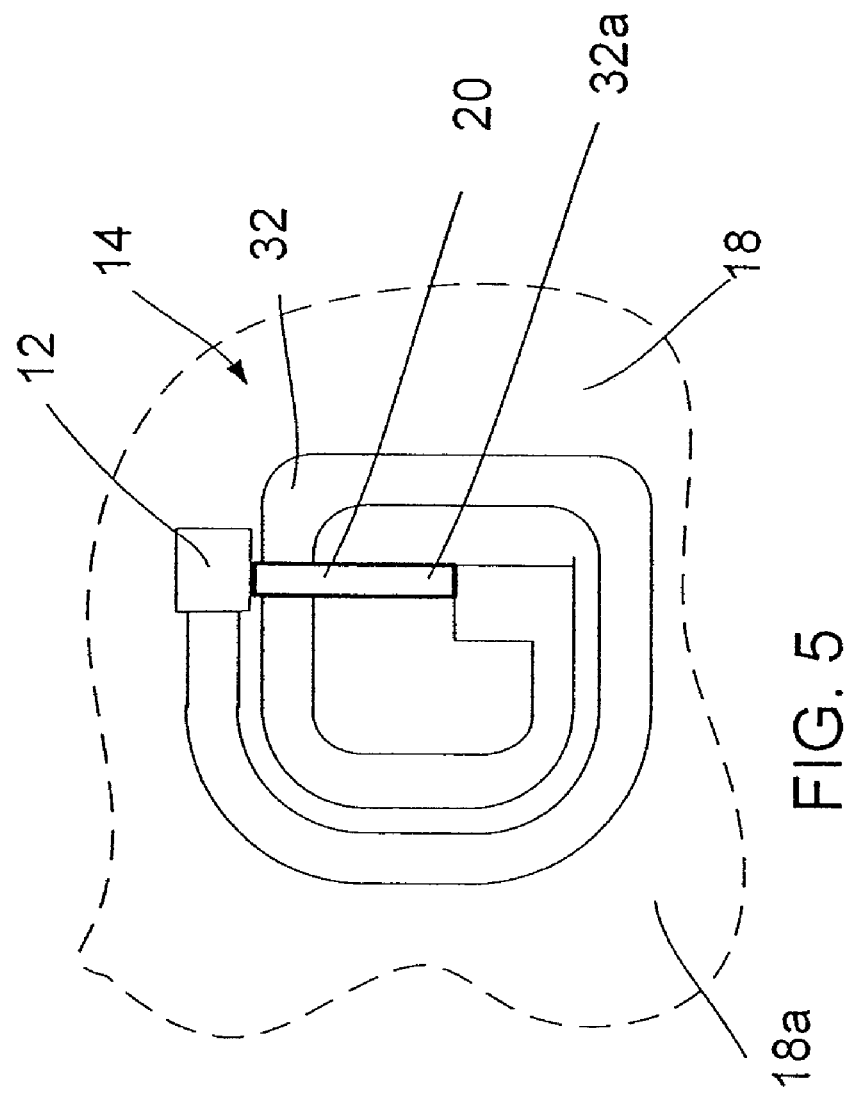
FIG. 5 is a top view of a 13.56 MHz RFID tag constructed in accordance with the present invention, shown as mounted on a carton or pallet.
Figure 6:
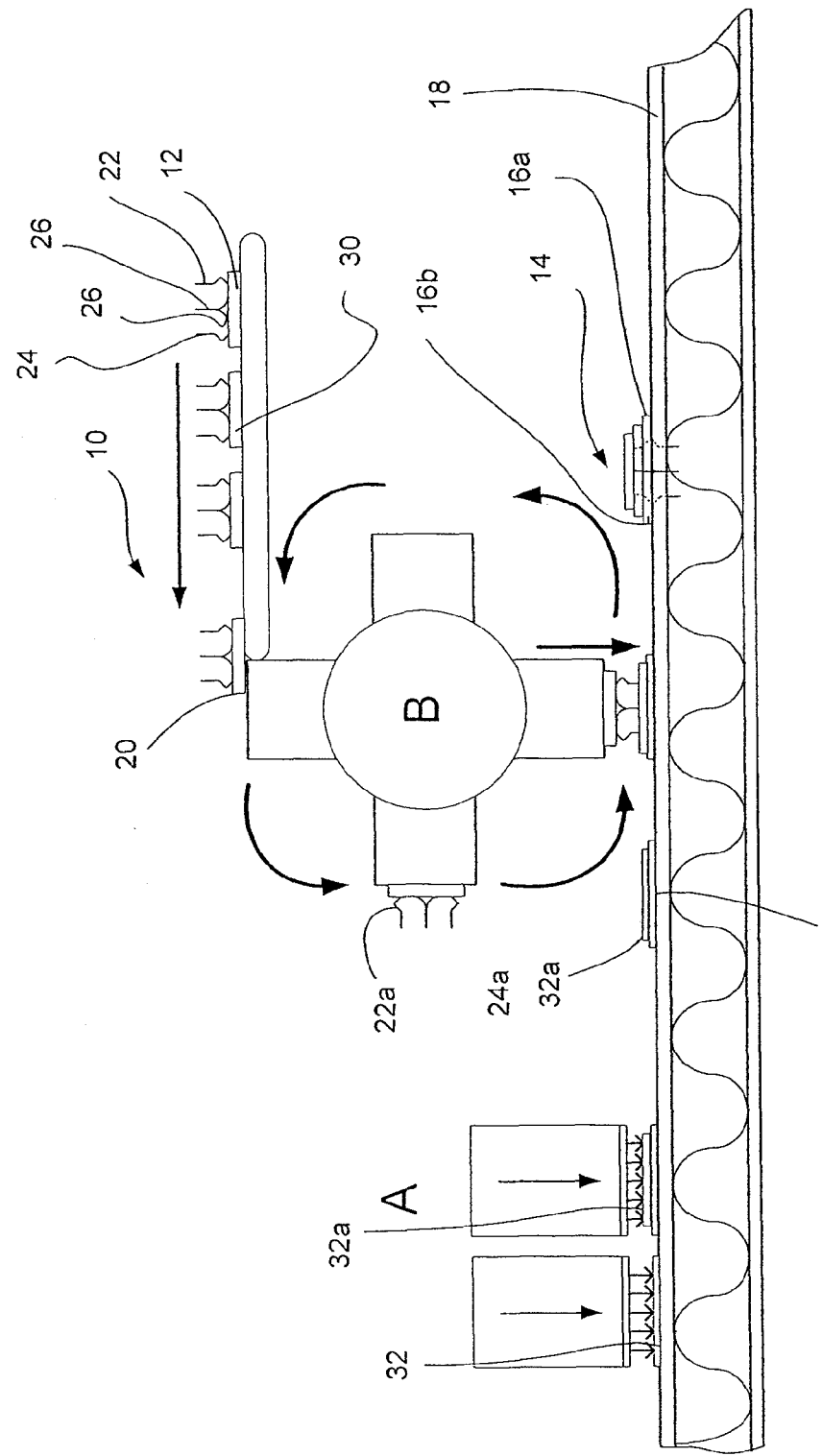
FIG. 6 is a simplified schematic view of a system for installing an RFID tag on a shipping article for use in accordance with a second preferred embodiment of the present invention.

Alternatively, as shown in FIG. 5, the strip 16 may be in the form of a coil 32 to form a 13.56 MHz antenna. FIG. 6 a depicts a simplified schematic view of a system for installing a 13.56 MHz RFID tag on a shipping article. The 13.56 MHz antenna of FIG. 5 requires two layers of conductive material 32 (in the shape of a coil), and 32a (in the form of a short length of foil). The two layers 32 and 32a are separated from one another by means of a dielectric on the foil of the conductive material. This is taught, for example, in U.S. application Ser. No. 10/253,733, entitled Security Tag and Process for Making Same, by Appalucci et al., assigned to Checkpoint Systems, Inc. and published as U.S. Application Publication No. 2003/0051806, the complete specification of which is fully incorporated by reference hereto.

Here, an adhesive is applied to the second layer of foil 32a (or substrate associated therewith). The adhesive forms an adhesive layer which, preferably, is an aggressive, pressure sensitive adhesive such as a vinyl acetate monomer, which provides a high initial tack when cured by an air dryer and which achieves a high bonding strength when subjected to pressure. Other types of aggressive adhesives such as heat seal adhesives and those which may be cured by ultra violet rays or electron beams may also be used.

Preferably, the first conductive foil is an aluminum alloy having a purity of about 98%, a thickness in the range of 20-100 microns and preferably 30-70 microns, and forming properties such as hardness and ductility suitable for die cutting.

Preferably, the second layer of foil 32a is flood coated with a dielectric to provide dielectric layers having a thickness in the range of 1-25 microns and preferably 1-10 microns. Preferably, the dielectric is a heat seal dielectric material, such as polyethylene which readily bonds to aluminum. However, other dielectric materials, such as a styrene-acrylate polymer or a vinyl acetate could also be used. Preferably, the foil is purchased with the dielectric layers already applied. However, the dielectric layers may be applied to the foil by printing the dielectric on-line using a gravure knife over roll or a similar printing process. The dielectric is located between the two layers 32 and 32a.

Here, the RFID chip 12 is placed between the two layers 32 and 32a such that the a barb 22 makes electrical contact with one end of the coil (layer 32), while the second barb 24 makes contact with an end of second layer 32a. In this application, the nonconductive fin 26 is not required.

FIGS. 7a and 7b show simplified 13.56 MHz RFID tags that have a non-overlapping loop. In FIG. 7a, the RFID Chip 12a includes a built-in capacitor such that no separate capacitor layer constructed from foil and dielectric is required. In FIG. 7b, the RFID chip 12b does not include a separate capacitor such that a separate capacitor layer constructed from foil and dielectric is required. Here, the nonconductive fin 26 severs the trace of the conductive foil 16.

While the invention has been described in detail and with reference to specific examples thereof, it will be apparent to one skilled in the art that various changes and modifications can be made therein without departing from the spirit and scope thereof.

What is claimed is:

1. A method for installing an RFID tag on a shipping article, comprising the steps of:
   (A) applying a first strip and a second strip of conductive material to the surface of the shipping article, said strips being co-linear and separated from one another by a small gap;
   (B) providing an RFID chip having a body, a first contact point and a second contact point, the first and second contact points each located on the bottom of the body;
   (C) attaching the RFID chip to the shipping article by adhering the first contact point to the first strip of conductive material on the shipping article and adhering the second strip of conductive material to the second strip of conductive material on the shipping article;
   (D) wherein the first contact point is a first barb and the second contact point is a second barb, each barb extending downwardly from the body and received in the shipping article, and the RFID chip is attached to the shipping article by inserting the first barb through the first strip of conductive material into the shipping article and inserting the second barb through the second strip of conductive material into the shipping article, wherein the first barb provides substantially all electronic connection between the RFID chip and the first strip of conductive material and the second barb provides substantially all electronic connection between the RFID chip and the second strip of conductive material; and
   (E) applying the RFID tag to the shipping article in an assembly line process wherein the shipping article does not stop its movement at a portion of the assembly line process where RFID tags are applied for the receipt of the tag.

2. The method of installing an RFID tag of claim 1, wherein the shipping article comprises an article selected from the group consisting of pallets, cartons, cardboard boxes and corrugated cardboard boxes.

3. The method of installing an RFID tag of claim 1, wherein the RFID chip is encapsulated.

4. The method of installing an RFID tag of claim 1, wherein the step including providing the RFID chip includes providing the first and second barbs having a curved portion adjacent to the body, whereby the RFID chip is attached to the shipping article with increased security.

5. The method of installing an RFID tag of claim 1, wherein the first strip and a second strip of conductive material form two poles of a dipole antenna.

6. A method for installing an RFID tag on a shipping article, comprising the steps of:
   (A) applying a coil of conductive material to the surface of the shipping article, the coil having a first layer in the shape of a coil and a second layer being a short length of foil, the second layer adhered to the first layer;
   (B) providing an RFID chip having a body, a first bottom conductive point and a second bottom conductive point;
   (C) attaching the RFID chip to the shipping article by inserting the chip onto the coil on the shipping article such that the first bottom conductive point is electrically attached to the first layer and the second bottom conductive point is electrically attached to the second layer;
   (D) wherein the first bottom conductive point is a first barb and the second bottom conductive point is a second barb, each barb extending downwardly from the body and received in the shipping article, and the RFID chip is attached to the shipping article by inserting the first barb through the first layer into the shipping article and inserting the second barb through the second layer into the shipping article, whereby the first barb provides substantially all electronic connection between the RFID chip and the first layer and the second barb provides substantially all electronic connection between the RFID chip and the second layer; and
   (E) applying the RFID tag to the shipping article in an assembly line process wherein the shipping article does not stop its movement at a portion of the assembly line process where RFID tags are applied for the receipt of the tag.

7. The method of installing an RFID tag of claim 6, wherein the shipping article comprises an article selected from the group consisting of pallets, cartons, cardboard boxes, and corrugated cardboard boxes.

8. The method of installing an RFID tag of claim 6, wherein the step including providing the RFID chip includes providing the first and second barbs having a curved portion, adjacent to the body, whereby the RFID chip is attached to the shipping article with increased security.

9. The method of installing an RFID tag of claim 6, wherein the RFID chip is encapsulated for structural support.

* * * * *